(12) United States Patent
Chen et al.

(10) Patent No.: US 8,120,907 B2
(45) Date of Patent: Feb. 21, 2012

(54) AIRFLOW GUIDING AND HEAT DISSIPATING ASSEMBLY FOR ELECTRONIC DEVICE

(75) Inventors: Wen-Hsiung Chen, Taipei Hsien (TW); Chien-An Chou, Taipei Hsien (TW); Chia-Hao Lin, Taipei Hsien (TW)

(73) Assignee: Acbel Polytech Inc., Taipei Hsien (TW)

( * ) Notice: Subject to any disclaimer, the term of this patent is extended or adjusted under 35 U.S.C. 154(b) by 174 days.

(21) Appl. No.: 12/485,100

(22) Filed: Jun. 16, 2009

(65) Prior Publication Data

US 2010/0212877 A1 Aug. 26, 2010

(30) Foreign Application Priority Data

Feb. 25, 2009 (TW) .............................. 98105929 A

(51) Int. Cl.
*H05K 7/20* (2006.01)
(52) U.S. Cl. .......................... 361/690; 361/695; 361/719
(58) Field of Classification Search ......................... None
See application file for complete search history.

(56) References Cited

U.S. PATENT DOCUMENTS

| | | | | |
|---|---|---|---|---|
| 6,400,568 | B1 * | 6/2002 | Kim et al. ...................... | 361/697 |
| 6,710,240 | B1 * | 3/2004 | Chen et al. ................. | 174/17 VA |
| 7,345,873 | B2 * | 3/2008 | Dey et al. ...................... | 361/695 |
| 7,403,387 | B2 * | 7/2008 | Pav et al. ...................... | 361/694 |
| 7,760,498 | B2 * | 7/2010 | Shan et al. ..................... | 361/695 |
| 2005/0036288 | A1 * | 2/2005 | Shen et al. ..................... | 361/695 |
| 2005/0168940 | A1 * | 8/2005 | Askeland et al. ............. | 361/687 |
| 2007/0235168 | A1 * | 10/2007 | Chen et al. ..................... | 165/124 |
| 2008/0041562 | A1 * | 2/2008 | Bhatia .......................... | 165/80.3 |
| 2008/0074841 | A1 * | 3/2008 | Curtis et al. .................. | 361/695 |
| 2008/0123289 | A1 * | 5/2008 | Sun ............................... | 361/687 |

* cited by examiner

*Primary Examiner* — Gregory Thompson
(74) *Attorney, Agent, or Firm* — Rabin & Berdo, P.C.

(57) ABSTRACT

An airflow guiding and heat dissipating assembly is mounted in an electronic device and has a base and at least one baffle being mounted on the base. Multiple electronic components are mounted on the base and are arranged in a line. Airflow flows along one electronic component upstream, past the baffle and then over the other electronic component downstream to take away heat from the electronic component. The baffle prevents the airflow from becoming turbulent and, therefore, temperatures of the electronic component are lowered efficiently.

16 Claims, 12 Drawing Sheets

AIRFLOW GUIDING AND HEAT DISSIPATING ASSEMBLY FOR ELECTRONIC DEVICE

BACKGROUND OF THE INVENTION

1. Field of the Invention

The present invention relates to an airflow guiding and heat dissipating assembly, especially to an airflow guiding and heat dissipating assembly that is mounted in an electronic device and guides an airflow to efficiently dissipate heat inside the electronic device.

2. Description of the Prior Arts

Electronic components such as transformers, inductors, resistors and the like that are mounted in an electronic device generating unnecessary heat while operating. Therefore, heat conductors such as thermal pads or thermal grease are used to conduct heat out of the electronic components. Furthermore, the heat should be dissipated away from the electronic components by an airflow to prevent overheating of the electronic components. The airflow may be generated by a thermal fan being mounted in the electronic device, or by a convention current between heat dissipation holes being formed through a casing of the electronic device.

With reference to FIG. 13, an electronic device (50) comprises a casing (53) and multiple electronic components (52A, 52B). The casing (53) has two opposite sidewalls and multiple heat dissipation holes (531) being formed through the sidewalls. Thus, air outside the casing (53) flows into the casing (53) from the heat dissipation holes (531) of one sidewall of the casing (53) and flows out of the casing (53) from the heat dissipation holes (531) of the other sidewall of the casing (53) to form an airflow (51). The electronic components (52A, 52B) may be transformers, are mounted in the casing (53) and are arranged in a line along the airflow (51). Therefore, the airflow dissipates heat from the electronic components (52A, 52B). Moreover, according to a direction of the airflow, upstream electronic components (52A) are more effectively cooled than downstream electronic components (52B).

With further reference to FIG. 14, while the airflow (51) passes through the electronic components (52A, 52B), part of the airflow (51) slows down and becomes turbulent between the electronic components (52A, 52B) causing the heat to accumulate between the electronic components (52A, 52B). Consequently, temperatures of the electronic components (52A, 52B), especially temperature of the electronic component (52B) downstream, are raised and may be damaged.

With further reference to FIG. 15, in order to prevent the heat accumulating between the electronic components (52A, 52B) and increase upstream and downstream cooling efficiency, the electronic components (52A, 52B) are arranged staggered to allow the airflow to dissipate the heat from the electronic components (52A, 52B) individually and to cool down the electronic components (52A, 52B) efficiently.

However, miniaturization of electronic devices (50) requires lighter and smaller components, so the electronic components (52A, 52B) that are arranged staggered occupy larger spaces in the electronic device (50) and limit a minimum size of the electronic device (50).

To overcome the shortcomings, the present invention provides an airflow guiding and heat dissipating assembly for an electronic device to mitigate or obviate the aforementioned problems.

SUMMARY OF THE INVENTION

The main objective of the present invention is to provide an airflow guiding and heat dissipating assembly for an electronic device. The airflow guiding and heat dissipating assembly is mounted in the electronic device and has a base and at least one baffle being mounted on the base. Multiple electronic components are mounted on the base and are arranged in a line.

Airflow flows along one electronic component upstream, past the baffle and then over the other electronic component downstream to take away heat from the electronic components. The baffle prevents the airflow from becoming turbulent and therefore, temperatures of the electronic component are lowered efficiently.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
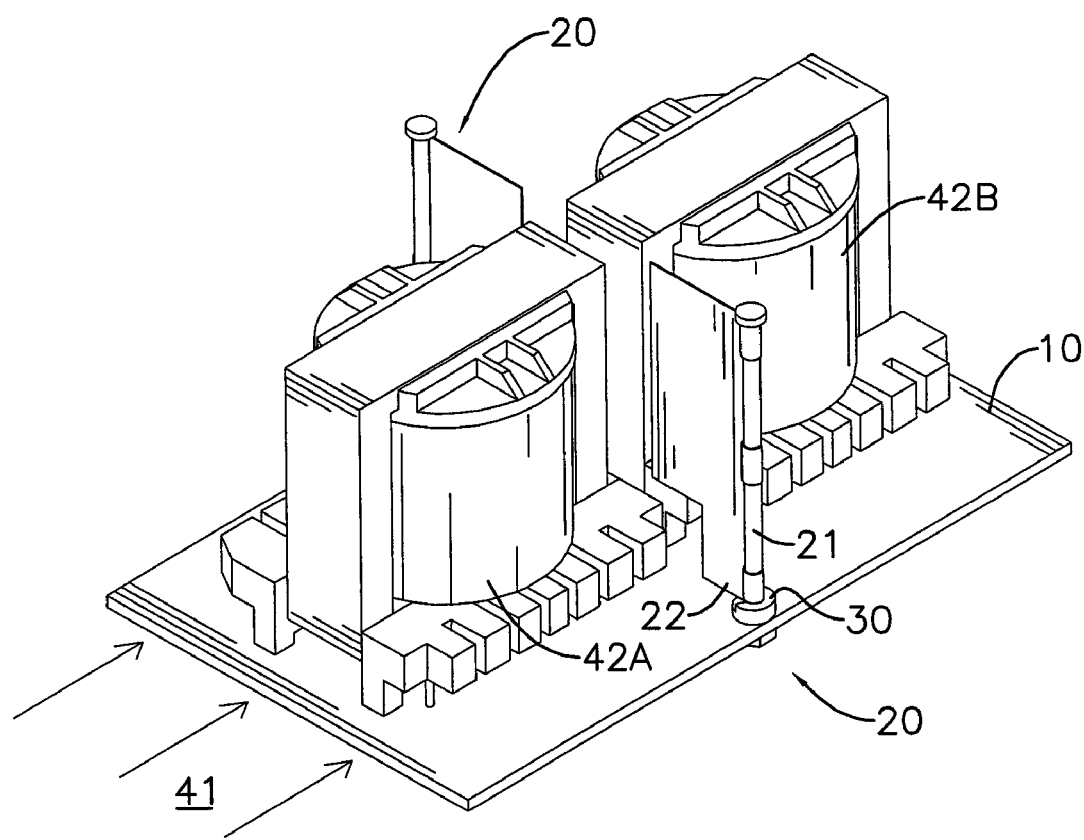
FIG. 1 is a perspective view of an airflow guiding and heat dissipating assembly for an electronic device in accordance with the present invention.
Figure 2:
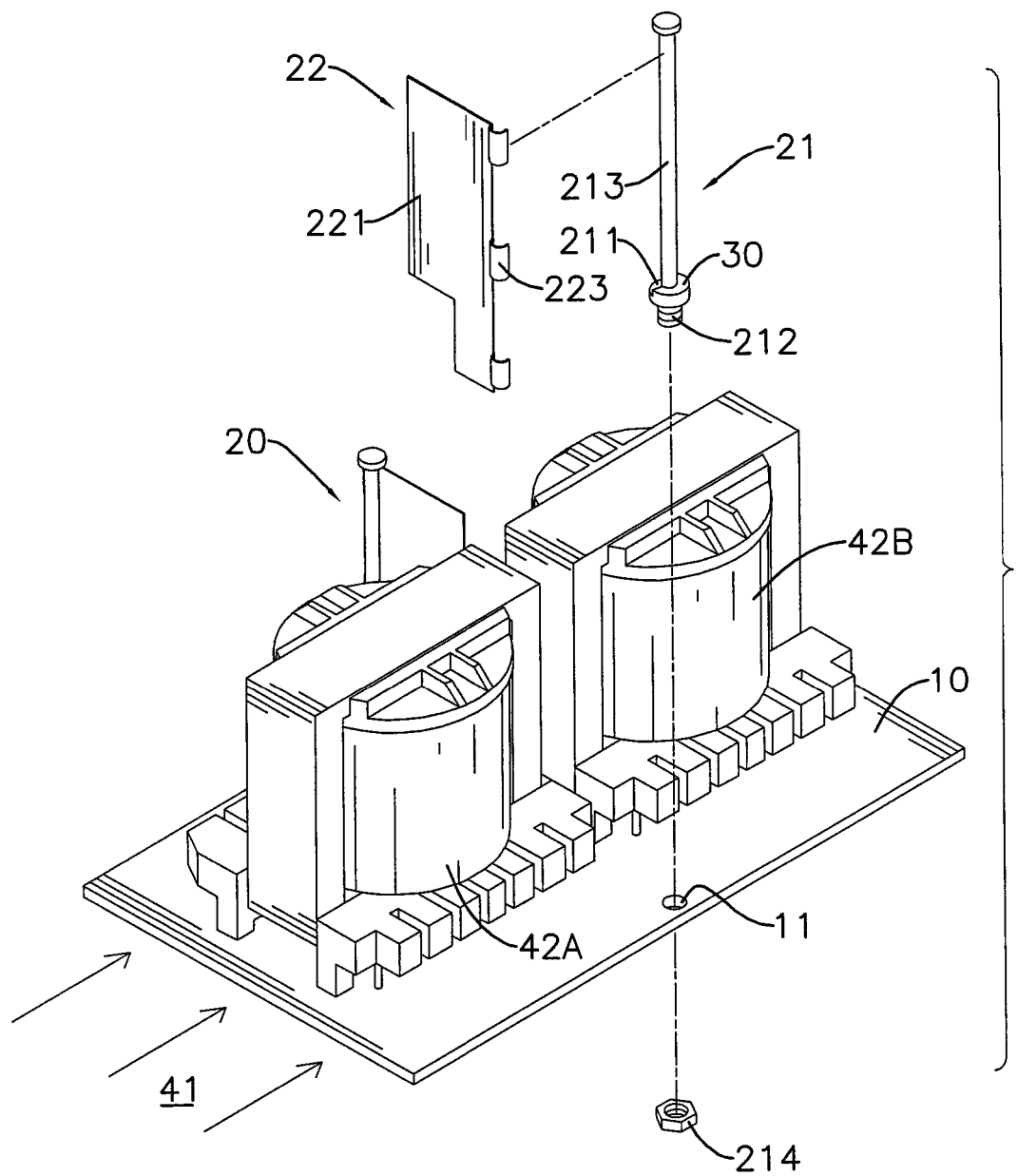
FIG. 2 is an exploded perspective view of the airflow guiding and heat dissipating assembly in FIG. 1, showing a first embodiment of a shaft and a first embodiment of a stop.

With further reference to FIG. 2, the base (10) may be integrated with a circuit board, has an upper surface and a lower surface and may have at least one mounting hole (11).

Multiple electronic components (42A, 42B) of the electronic device such as transformers, resistors, microchips, or the like are mounted on the upper surface of the base (10) and are arranged in a line along the airflow (41). Each of the at least one mounting hole (11) is formed through the base (10) near, and maybe between, two of the electronic components (42A, 42B) that are adjacent to each other.

With further reference to FIG. 2, the base (10) may be integrated with a circuit board, has an upper surface and a lower surface and may have at least one mounting hole (11). Multiple electronic components (42A, 42B) of the electronic device such as transformers, resistors, microchips, or the like are mounted on the upper surface of the base (10) and are arranged in a line along the airflow (41). Each of the at least one mounting hole (11) is formed through the base (10) near, and maybe between, two adjacent electronic components (42A, 42B).

Figure 10:
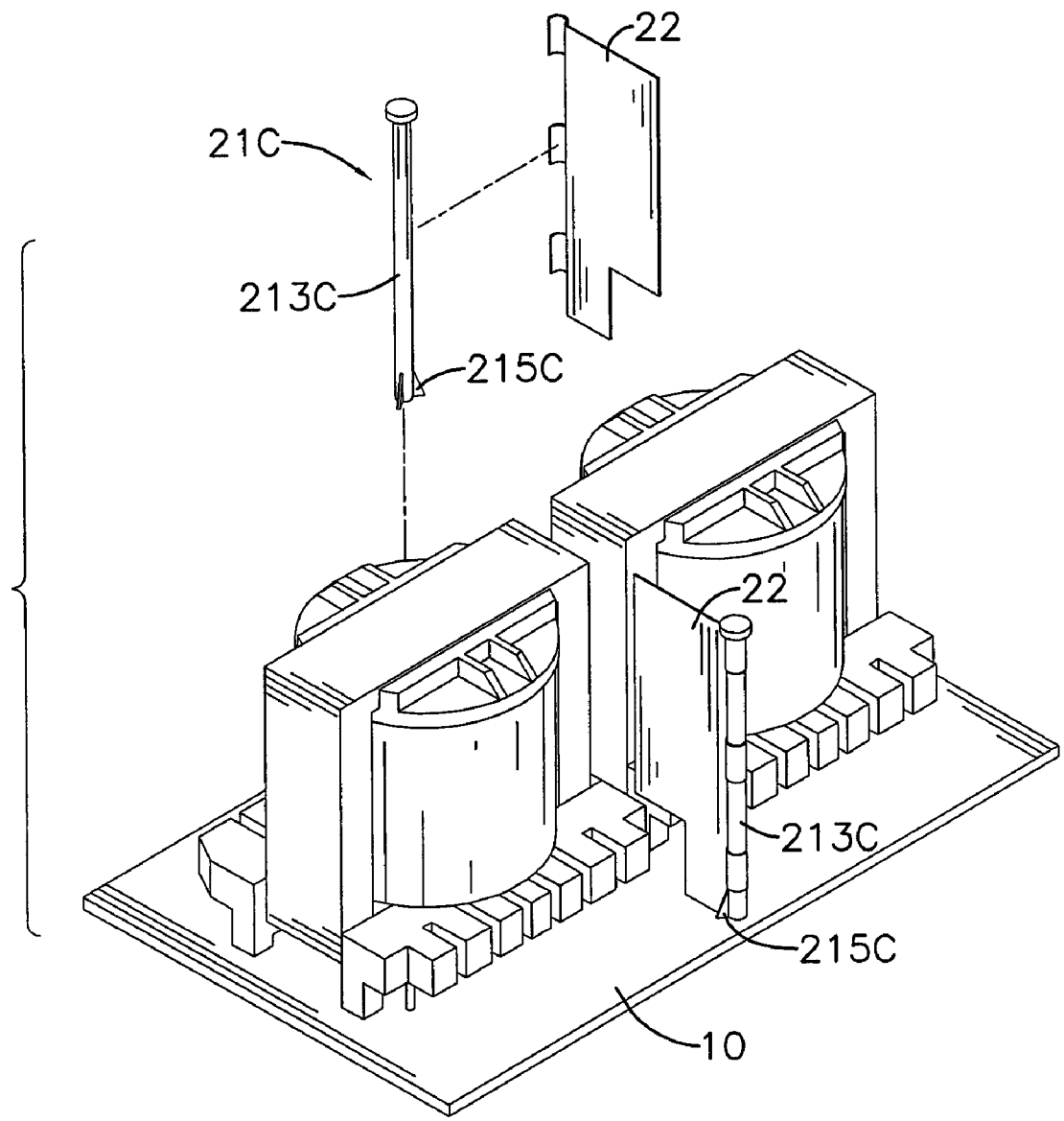
FIG. 10 is an exploded perspective view of the heat dispersing assembly in FIG. 1, showing a second embodiment of the shaft.
Figure 11:
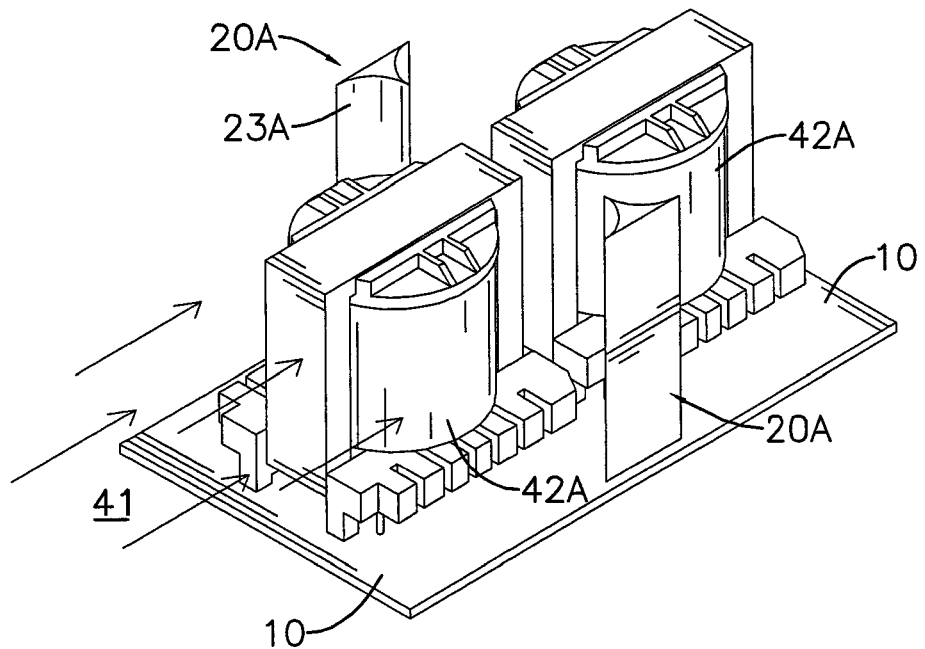
FIG. 11 an operational perspective view of a second embodiment of a airflow guiding and heat dissipating assembly for an electronic device in accordance with the present invention.
Figure 12:
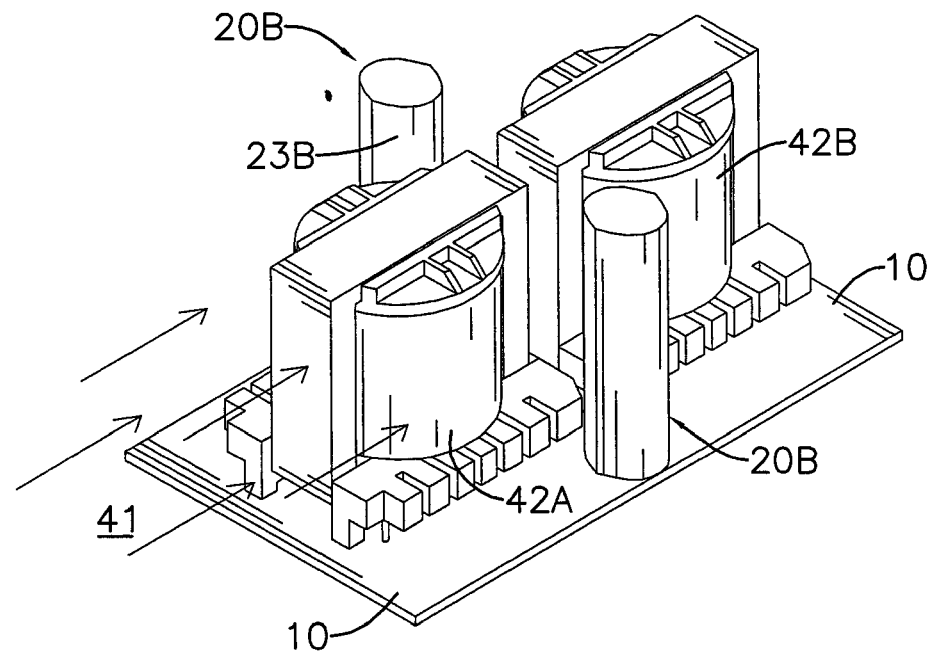
FIG. 12 an operational perspective view of a third embodiment of a airflow guiding and heat dissipating assembly for an electronic device in accordance with the present invention.
Figure 13:
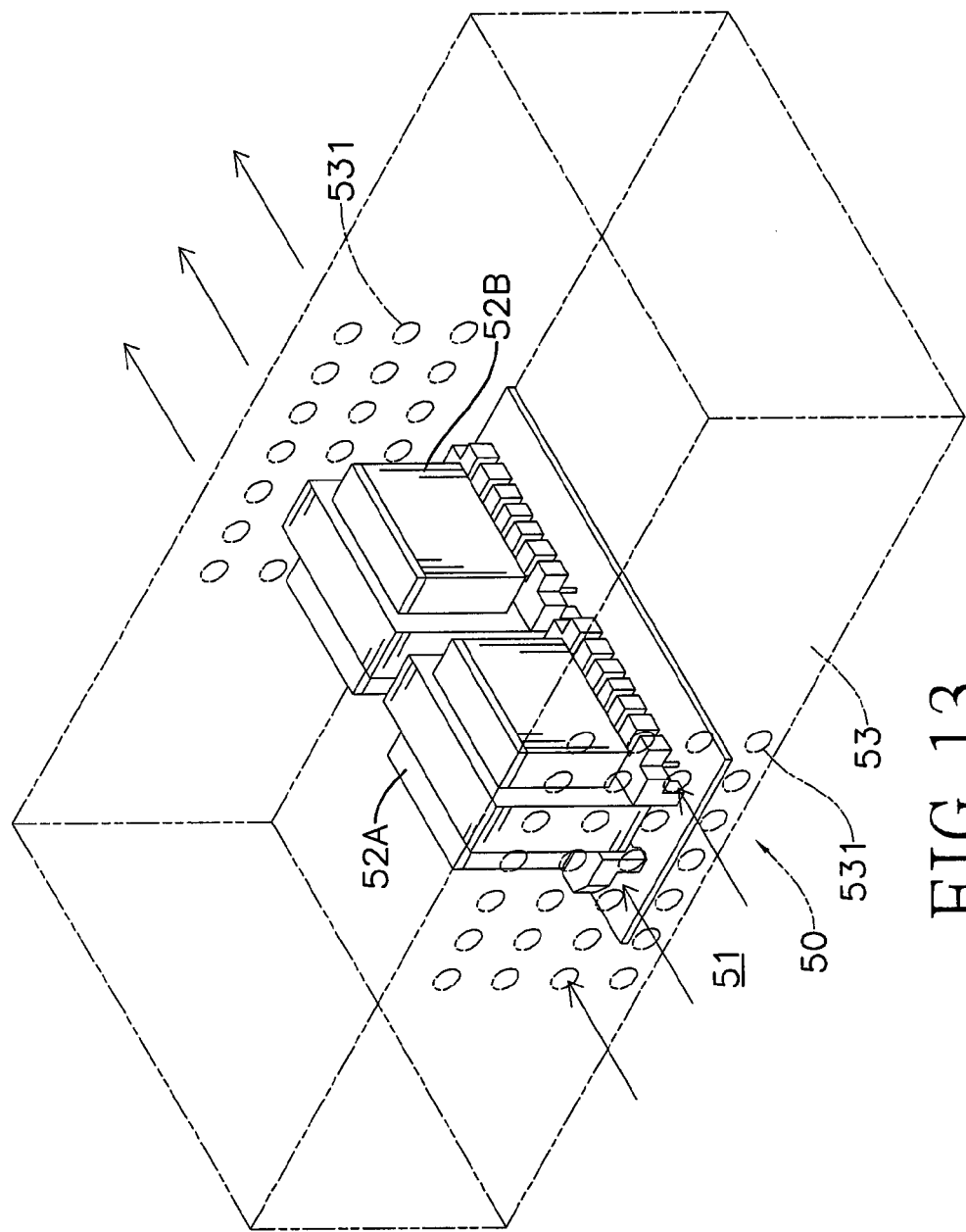
FIG. 13 is a perspective view of an electronic device.
Figure 14:
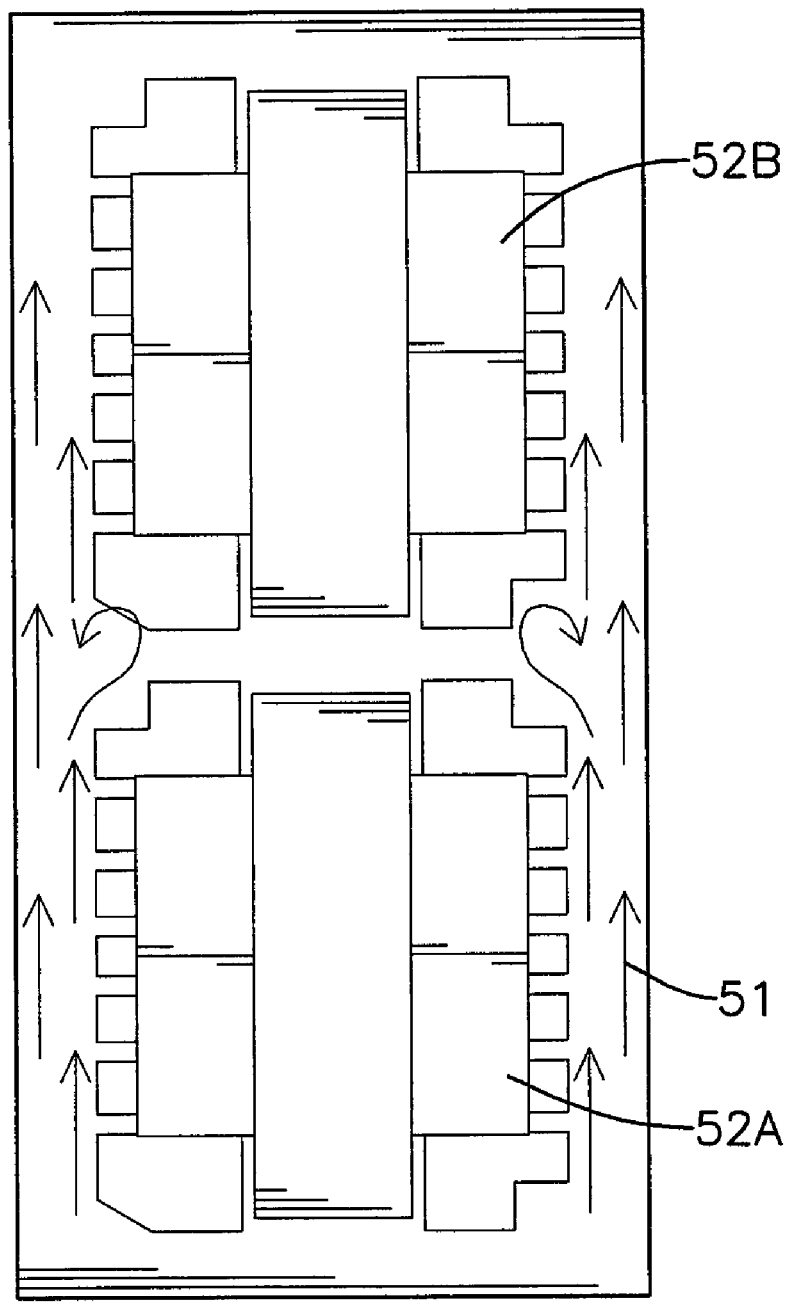
FIG. 14 is a top view of the electronic device in FIG. 13.
Figure 15:
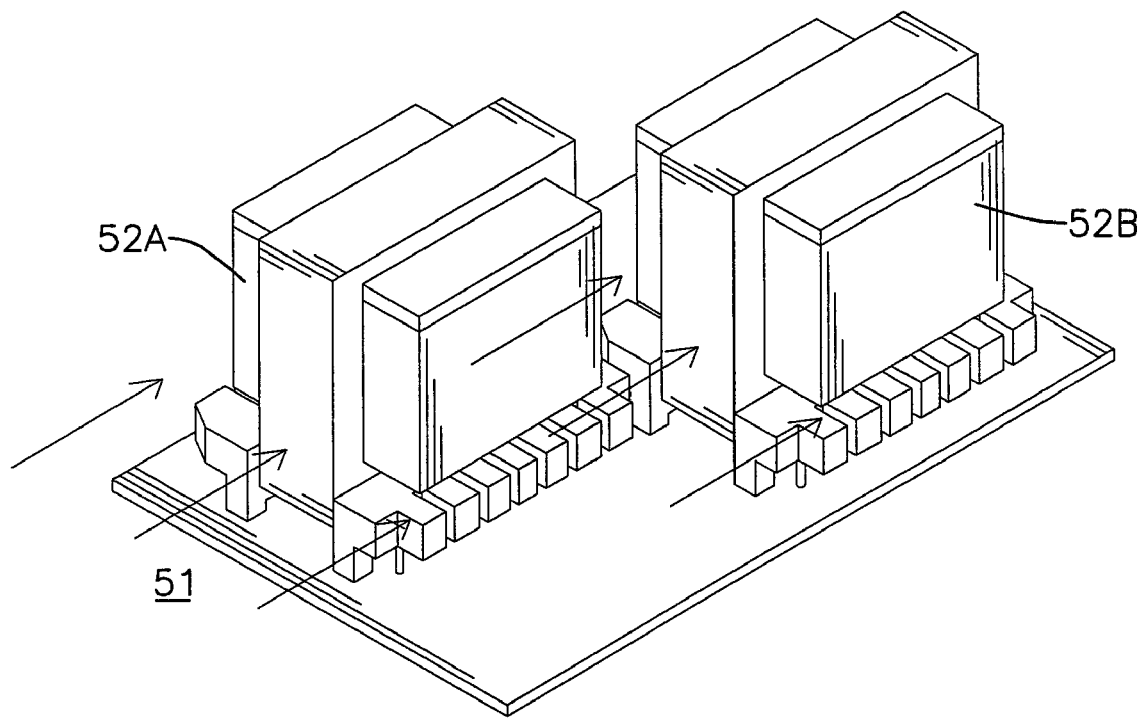
FIG. 15 is a perspective view of another electronic device.

With further reference to FIGS. 10 to 12, the at least one baffle (20, 20A, 20B) is mounted on the base (10) near, and maybe between, the electronic components (42A, 42B) to prevent turbulent air forming. Each of the at least one baffle (20) may have a shaft (21C, 21), a baffle panel (22) and a fastener (214) (as shown in FIG. 2).

With reference to FIG. 10, the shaft (21C) is mounted on the upper surface of the base (10) and may have a rod (213C) and multiple wings (215C). The rod (213C) is perpendicularly mounted on the upper surface of the base (10), may be by a surface mount technology (SMT) and has a proximal end. The wings (215C) protrude radially from the rod (213C) adjacent to the proximal end of the rod (213C) and abut the upper surface of the base (10) to allow the shaft (21C) to stand stably on the upper surface of the base (10).

With reference to FIGS. 2 and 4 to 6, the shaft (21) is mounted on the upper surface of the base (10) and in a corresponding mounting hole (11) of the base (10) and has a shoulder (211), a fastening end (212, 212A, 212B) and a rod (213).

The shoulder (211) is mounted on the upper surface of the base (10) and has a lower surface and an upper surface.

The fastening end (212, 212A, 212B) axially protrudes from the lower surface of the shoulder (211), is mounted through the corresponding mounting hole (11) of the base (10), is secured to the lower surface of the base (10) and may be threaded or may be implemented with a rivet head (212B).

Figure 4:
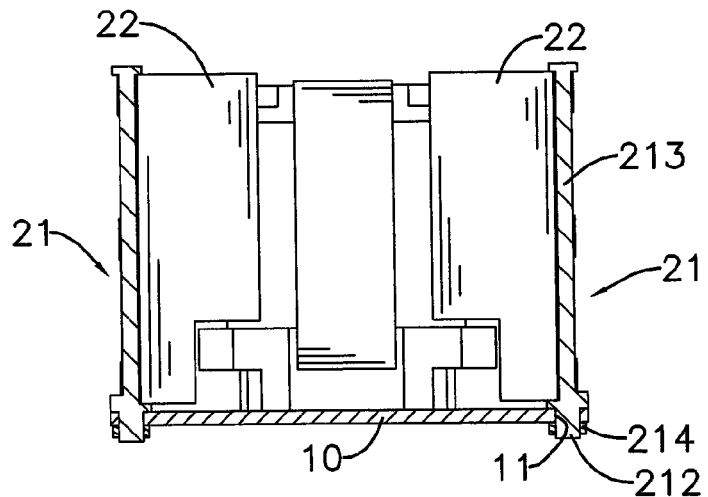
FIG. 4 is a side view in partial section of the airflow guiding and heat dissipating assembly in FIG. 1, showing a fastener being mounted around a fastening end of a shaft.

With reference to FIG. 4, the fastener (214) is mounted on and engages the threaded the fastening end (212) of the shaft (21) and abuts the lower surface of the base (10) to allow the shaft (21) to securely and stably stand on the base (10).

Figures 5A, 5B:
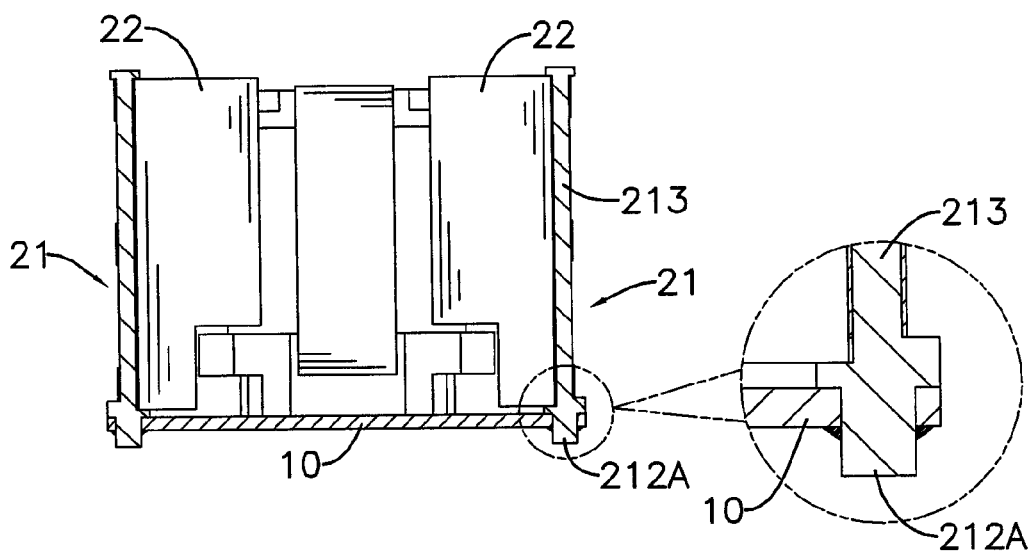
FIG. 5A is a side view in partial section of the airflow guiding and heat dissipating assembly in FIG. 1, showing the fastening end of the shaft being soldered to a base.
FIG. 5B is an enlarged side view in partial section of the airflow guiding and heat dissipating assembly in FIG. 1.

With reference to FIGS. 5A and 5B, the fastening end (212A) of the shaft (21) may be soldered to the lower surface of the base (10) to allow the shaft (21) to securely and stably stand on the base (10).

Figure 6:
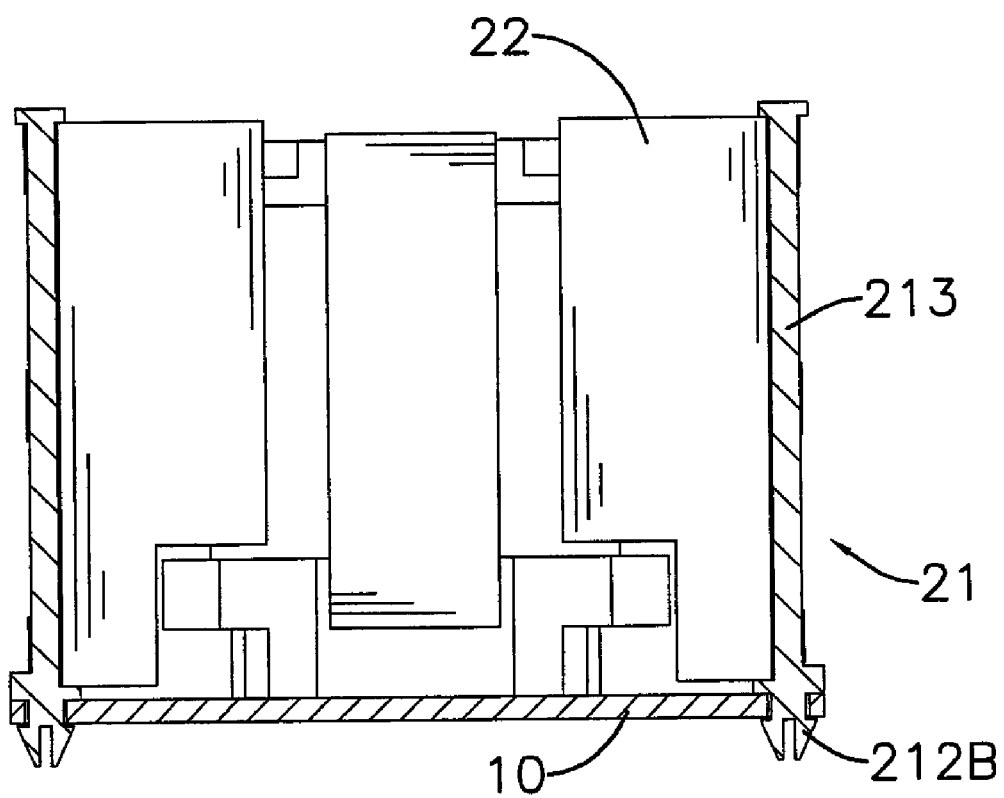
FIG. 6 is a side view in partial section of the airflow guiding and heat dissipating dispersing assembly in FIG. 1, showing the fastening end of the shaft hooking the base.

With reference to FIG. 6, the rivet head (212B) of the shaft (21) is resilient and comprises multiple hooks grabbing the lower surface of the base (10) to allow the shaft (21) to securely and stably stand on the base (10).

The rod (213) axially protrudes up from the upper surface of the shoulder (211).

Figure 7:
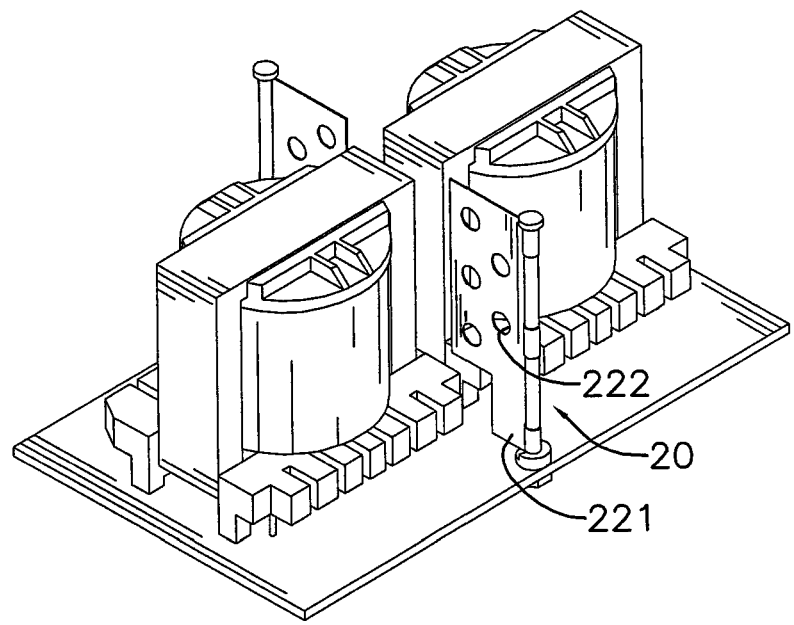
FIG. 7 is a perspective view of the airflow guiding and heat dissipating assembly in FIG. 1, showing multiple through holes being formed through the baffle panel.

With further reference to FIG. 7, the baffle panel (22) is rotatably mounted on the shaft (21), may be rotatably mounted on the rod (213) of the shaft (21) and may have a leaf (221), at least one barrel (223) (as shown in FIG. 2) and multiple through holes (222). The leaf (221) has a side edge and a bottom edge. The at least one barrel (223) is formed on and protrudes from the side edge of the leaf (221), is rotatably mounted around the rod (213C, 213) of the shaft (21C, 21) to allow the baffle panel (22) to rotate relative to the shaft (21C, 21) and may be an arc in cross-section. The through holes (222) are formed through the leaf (221) to allow the airflow to pass through.

With reference to FIG. 11, each of the at least one baffle (20A) may be a triangular post, is perpendicularly mounted on the upper surface of the base (10) by the SMT and has at least one guiding surface (23A). Each of the at least one guiding surface (23A) oblique to the airflow, may be arced and joined at an apex.

With reference to FIG. 12, each of the at least one baffle (20B) maybe an elliptical post, is perpendicularly mounted on the upper surface of the base (10) by the SMT and has a guiding surface (23B). The guiding surface (23B) is oblique to the airflow and may be semi-cylindrical.

Figure 8:
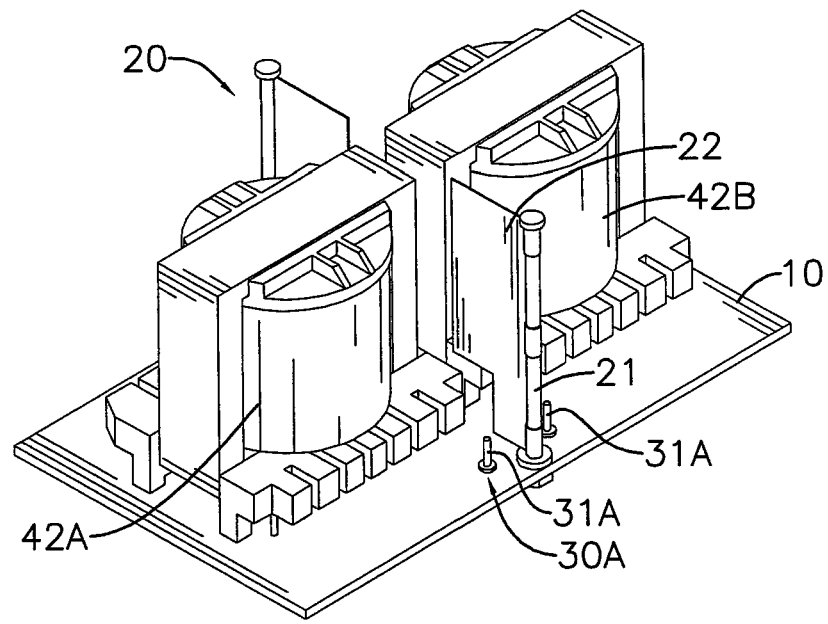
FIG. 8 is a perspective view of the airflow guiding and heat dissipating assembly in FIG. 1, showing a second embodiment of the stop.
Figure 9:
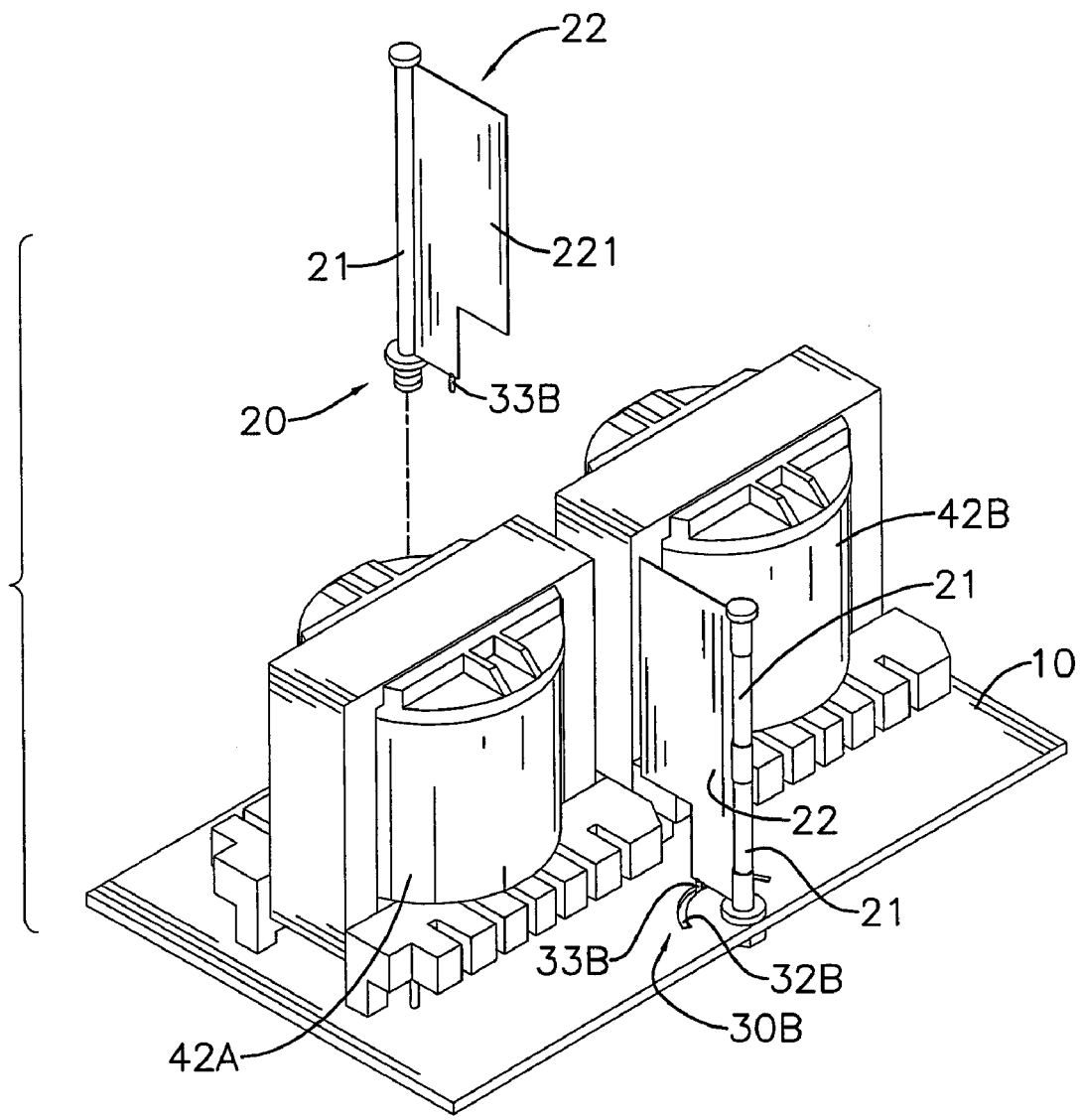
FIG. 9 is an exploded perspective view of the airflow guiding and heat dissipating assembly in FIG. 1, showing a third embodiment of the stop.

With further reference to FIGS. 8 and 9, each of the at least one stop (30, 30A, 30B) is formed beside a corresponding baffle (20) to limit a rotating angle of the baffle panel (22) of the corresponding baffle (20) to hold the baffle panel (22) obliquely between the electronic components (42A, 42B).

With reference to FIG. 2, each of the at least one stop (30) may be a protrusion, may be formed on the upper surface of the shoulder (211) of the shaft (21) and around the rod (213) of the shaft (21) and may have two ends. The ends of the stop (30) selectively stops the baffle panel (22) of the corresponding baffle (20).

With reference to FIG. 8, each of the at least one stop (30A) may have at least one bar (31A). The at least one bar (31A) protrudes from the upper surface of the base (10) beside the shaft (21) of the corresponding baffle (20) and selectively stops the baffle panel (22) of the corresponding baffle (20).

With reference to FIG. 9, each of the at least one stop (30B) may have a groove (32B) and a bar (33B). The groove (32B) is an arc and is formed in the upper surface of the base (10) around the shaft (21) of the corresponding baffle (20). The bar (33B) protrudes down from the bottom edge of the leaf (221) of the baffle panel (22) of the corresponding baffle (20) and is mounted through the groove (32B). Therefore, the baffle panel (22) of the corresponding baffle (20) is limited to pivot along the groove (32B) of the stop (30B).

With reference to FIG. 10, the wings (215C) of the shaft (21C) may also be used to limit a pivot angle of the baffle panel (22).

Figure 3:
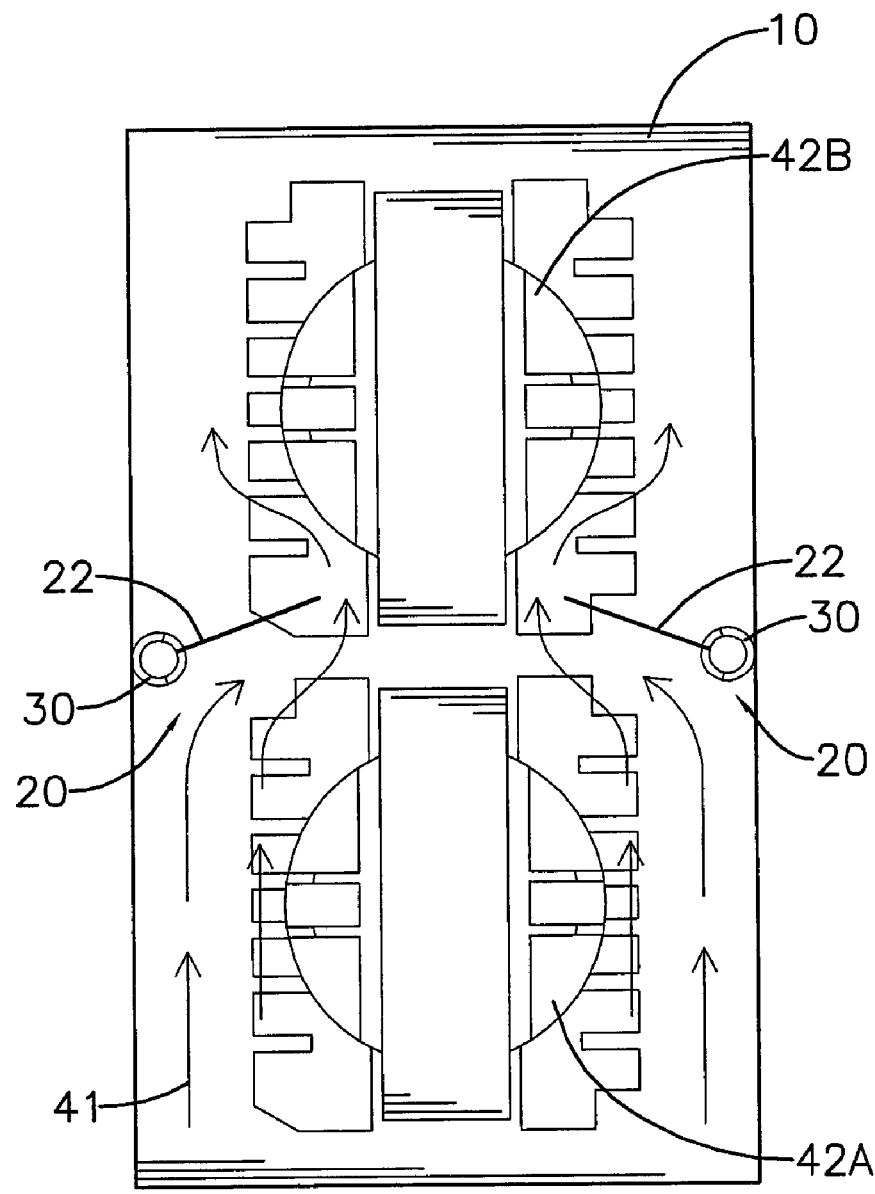
FIG. 3 is an operational top view of the airflow guiding and heat dissipating assembly in FIG. 1.

With reference to FIG. 3, the airflow guiding and heat dissipating assembly for the electronic device as described has the following advantages. Since the electronic components (42A, 42B) are arranged in the line along the airflow (41), the airflow (41) flows along the electronic component (42A) upstream, the baffle (20, 20A, 20B) and then the electronic component (42B) downstream to take away unnecessary heat around the electronic component (42A, 42B). The baffle (20, 20A, 20B) prevents the airflow (41) becoming turbulent between the electronic components (42A, 42B). Therefore, temperatures of the electronic component (42A, 42B) are lowered efficiently.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An airflow guiding and heat dissipating assembly, comprising:
    a base having a lower surface and an upper surface, the upper surface being adapted for mounting multiple electronic components; and
    a baffle having a shaft mounted on the upper surface of the base and a baffle panel rotatably mounted on the shaft, the baffle being adapted to be near and between two of the electronic components that are adjacent to each other.

2. The airflow guiding and heat dissipating assembly as claimed in claim 1, wherein the shaft of the baffle further has
    a rod perpendicularly mounted on the upper surface of the base and having a proximal end; and
    multiple wings protruding radially from the rod adjacent to the proximal end of the rod and abutting the upper surface of the base.

3. The airflow guiding and heat dissipating assembly as claimed in claim 1, wherein
    the base further has a mounting hole formed through the base;
    the shaft of the baffle includes:
        a shoulder disposed on the upper surface of the base and having a lower surface and an upper surface;
        a fastening end axially protruding from the lower surface of the shoulder, and being received through the mounting hole of the base so that a portion of the fastening end is disposed on the lower surface of the base; and
        a rod axially protruding up from the upper surface of the shoulder.

4. The airflow guiding and heat dissipating assembly as claimed in claim 3, wherein
    the fastening end of the shaft is threaded; and
    the baffle further has a fastener mounted on and engaging the fastening end of the shaft and abutting the lower surface of the base so that the fastening end of the shaft is secured to the lower surface of the base.

5. The airflow guiding and heat dissipating assembly as claimed in claim 3, wherein the fastening end of the shaft is soldered to the lower surface of the base so that the fastening end of the shaft is secured to the lower surface of the base.

6. The airflow guiding and heat dissipating assembly as claimed in claim 3, wherein the fastening end of the shaft includes a rivet head, the rivet head being resilient and comprising multiple hooks grabbing the lower surface of the base so that the fastening end of the shaft is secured to the lower surface of the base.

7. The airflow guiding and heat dissipating assembly as claimed in claim 2, wherein the baffle panel of the baffle is rotatably mounted on the rod of the shaft and has:
    a leaf having a side edge; and
    at least one barrel formed on and protruding from the side edge of the leaf, the at least one barrel being rotatably mounted around the rod of the shaft.

8. The airflow guiding and heat dissipating assembly as claimed in claim 3, wherein the baffle panel of the baffle is rotatably mounted on the rod of the shaft and has:
    a leaf having a side edge; and
    at least one barrel being on and protruding from the side edge of the leaf, the at least one barrel being rotatably mounted around the rod of the shaft.

9. The airflow guiding and heat dissipating assembly as claimed in claim 8, wherein the baffle panel of the baffle further has multiple through holes being formed through the leaf.

10. The airflow guiding and heat dissipating assembly as claimed in claim 1 further comprising a stop mounted beside the baffle and limiting a rotating angle of the baffle panel of the baffle.

11. The airflow guiding and heat dissipating assembly as claimed in claim 3, further comprising a stop mounted beside the baffle and limiting a rotating angle of the baffle panel of the baffle.

12. The airflow guiding and heat dissipating assembly as claimed in claim 11, wherein the stop is a protrusion that is formed on the upper surface of the shoulder of the shaft and around the rod of the shaft and has two ends selectively stopping the baffle panel of the baffle.

13. The airflow guiding and heat dissipating assembly as claimed in claim 11, wherein the stop further has at least one bar protruding from the upper surface of the base beside the shaft of the baffle and selectively stops the baffle panel of the baffle.

14. The airflow guiding and heat dissipating assembly as claimed in claim 11, wherein the stop further has a groove and a bar,
    the groove being an arc formed in the upper surface of the base around the shaft of the baffle,
    the bar protruding down from the bottom edge of the leaf of the baffle panel of the baffle and being mounted through the groove.

15. The airflow guiding and heat dissipating assembly as claimed in claim 1, further comprising
    a plurality of additional baffles, each of the additional baffles having an additional shaft mounted on the upper surface of the base and an additional baffle panel rotatably mounted on the additional shaft of each additional baffle, each additional baffle being adapted to be near and between two of the electronic components that are adjacent to each other, wherein
    the base further has a plurality of additional mounting holes formed through the base;
    the additional shaft of each additional baffle includes:
        an additional shoulder disposed on the upper surface of the base and having a lower surface and an upper surface;
        an additional fastening end axially protruding from the lower surface of the additional shoulder and being received through a corresponding one of the additional mounting holes of the base so that a portion of the additional fastening end is disposed on the lower surface of the base; and
        an additional rod axially protruding up from the upper surface of the additional shoulder.

16. The airflow guiding and heat dissipating assembly as claimed in claim 15, further comprising a plurality of additional stops, each additional stop being mounted beside a corresponding one of the additional baffles and limiting a rotating angle of the additional baffle panel of the corresponding additional baffle.

* * * * *